(12) United States Patent
Schulze et al.

(10) Patent No.: US 7,195,994 B2
(45) Date of Patent: Mar. 27, 2007

(54) METHOD FOR PRODUCTION OF DEEP P REGIONS IN SILICON, AND SEMICONDUCTOR COMPONENTS PRODUCED USING THE METHOD

(75) Inventors: Hans-Joachim Schulze, Ottobrunn (DE); Franz-Josef Niedernostheide, Münster (DE); Helmut Strack, München (DE)

(73) Assignee: Infineon Technologies AG, Munich (DE)

( * ) Notice: Subject to any disclaimer, the term of this patent is extended or adjusted under 35 U.S.C. 154(b) by 7 days.

(21) Appl. No.: 11/023,039

(22) Filed: Dec. 23, 2004

(65) Prior Publication Data

US 2005/0164476 A1 Jul. 28, 2005

(30) Foreign Application Priority Data

Dec. 23, 2003 (DE) .................. 103 61 134

(51) Int. Cl.
*H01L 21/425* (2006.01)
(52) U.S. Cl. .................. 438/514; 438/510
(58) Field of Classification Search ........ 438/514, 438/515
See application file for complete search history.

(56) References Cited

U.S. PATENT DOCUMENTS

| 3,761,319 A * | 9/1973 | Shannon ............. 438/357 |
| 2002/0111712 A1* | 8/2002 | Peshkin et al. ......... 700/230 |
| 2005/0056891 A1* | 3/2005 | Coleman ............. 257/347 |

FOREIGN PATENT DOCUMENTS

DE 102 40 107 A1 3/2004

OTHER PUBLICATIONS

Li et al. Properties of Silicon-On-Defect-LayerMaterial, 1996, Material Research Society, 396,745-750.*
Li,"New annealing process and explanation for novel silicon pn junctions formed by proton implantation," 1999, IEEE, Electronic Letters, vol. 35, 342,-343.*
Kaiser et al. "Mechanism of the Formation of Donor States in Heat-Treated Silicon," 1958, Physical Review, vol. 112, pp. 1546-1554.*
Wondrak et al. "Buried Recombination Layer with enhanced N-type Conductivity for silicon Devices," 1985, Physica B, vol. 129, 322-326.*
Bisello et al., "Radiation Damage of Standard and Oxygenated Silicon Diodes Irradiated by 16-MeV and 27-MeV Protons", IEEE Trans. on Nuclear Science vol. 48, No. 4, Aug. 2001, pp. 1020-1027, (8 pages).

* cited by examiner

*Primary Examiner*—B. William Baumeister
(74) *Attorney, Agent, or Firm*—Maginot, Moore & Beck

(57) ABSTRACT

The invention relates to a method for production of deep p regions in silicon, with the method having the following step: bombardment of an n substrate section, an n epitaxial section or an exposed weakly doped n region of a semiconductor component that is to be produced with high-energy particles, whose energy is chosen such that the previous n region is redoped to form a p region to the desired depth after a specific healing time at a specific healing temperature after the bombardment, and to its use for the production of semiconductor components, for example in order to carry out isolating diffusion.

15 Claims, 3 Drawing Sheets

DIODE

Thyristor

METHOD FOR PRODUCTION OF DEEP P REGIONS IN SILICON, AND SEMICONDUCTOR COMPONENTS PRODUCED USING THE METHOD

BACKGROUND

The invention relates to a method for production of deep p regions in silicon, and to semiconductor components produced using the method.

In the production of semiconductor components, there is frequently a wish to produce a p-doped zone which extends deep into the semiconductor component and which can be used as previously normal isolating diffusion or else for specific edge terminations, which penetrate into the depth, of the pn junction (see, for example, DE 102 40 107.1 A (not yet published) from Infineon Technologies AG). In the past, such dopings extending deep into the semiconductor were produced either by diffusion processes lasting for a very long time and at very high temperatures, or by a combination of trench production with subsequent side-wall doping.

In the case of semiconductor components such as IGBTs, diodes and thyristors, an anode emitter with low emitter efficiency is frequently desired, which at the same time makes a good resistive contact with the contact metal and in which process-dependent inhomogeneities, such as particles on the wafer surface during the ion implantation process, have no disadvantageous effects on the electrical characteristics of the components containing this p emitter.

A p emitter with low emitter efficiency has in the past been produced by, for example, a so-called transparent emitter being used, which not only has relatively light doping but in which the penetration depth of the dopant is shallow, particularly for IGBTs. This technique has, however, also already been adopted for diodes, in which case this approach has been found to be problematic in the case of diodes, in which the p emitter at the same time forms the reverse-biased pn junction, due to the lack of any capability to provide an effective edge termination for the pn junction formed in this way. Particularly in the case of transparent emitters, undesirable lateral inhomogeneities in the p-doped emitter can occur as a result of particles which are located on the wafer surface during the ion implantation. In order to overcome this, the so-called "ana" (German language abbreviation for healed/not healed) emitter was proposed, although this requires additional high-temperature process steps.

One object of the invention is therefore to specify a method for production of deep p regions in silicon, which avoids very long diffusions at very high temperatures or else trench production with subsequent side-wall doping, and to use this method to produce p-doped emitters with low emitter efficiency for semiconductor components such that a good resistive contact with the contact metal is also achieved, and such that process-dependent inhomogeneities have no disadvantageous effects on the electrical characteristics of the components which contain this p emitter or this anode.

This object is achieved according to the claims.

SUMMARY

According to a first aspect, a method according to the invention which achieves the above object is characterized by having the following step:

bombardment of an exposed n substrate, n epitaxial section or weakly doped n region of a semiconductor component that is to be produced with high-energy particles whose energy is chosen such that the previous n region is redoped to form a p region to the desired depth after a specific healing time at a specific healing temperature after the bombardment.

The high-energy particles which are used for bombardment may be protons, helium atoms or else electrons, with the method according to the invention preferably using proton beams.

For certain applications, for example for replacement of isolating diffusion, masking is required, which leaves the regions to be bombarded free.

In the case of proton bombardment, a metal mask is preferably used which is greatly thinned in those areas in which the p doping is intended to be produced, so that the protons lose scarcely any energy in passing through these thin sections. However, this mask may also be completely open over the regions through which the bombardment is intended to pass, provided that the remaining mask is formed to be cohesive and is sufficiently robust. In the remaining area of the component, the mask is sufficiently thick to completely absorb the protons there. Particularly in the case of proton bombardment, it may be advantageous for the production of vertical p regions which extend very deeply and are used to replace isolating diffusion to choose the particle energy to be sufficiently high that they pass completely through the silicon wafer underneath the thinned sections of the metal mask, that is to say they emerge again on the other side of the wafer.

This avoids the n-doping effect of hydrogen atoms, which is known from the literature, and thus a negative influence on the effect on the desired p doping. However, if, in fact, this n-doping effect of the protons is desirable, for example for production of a field stop zone in an IGBT, a diode or a thyristor, or else for production of a vertical edge termination, which results in a decreasing acceptor concentration in the vertical direction as a result of the vertical diffusion of the hydrogen atoms during the heat-treatment step in conjunction with the hydrogen-induced donor concentration which results from this and varies in the vertical direction, the proton beam energy is chosen such that the peak of the n-doping effect thereof is located at the desired depth in the component.

The major advantage of using lightweight high-energy particles, in particular protons, is the relatively great depth to which these particles penetrate into the silicon. In the case of protons, penetration depths of up to several hundred micrometers can be achieved, depending on the acceleration energy, so that it is possible for them to pass completely through semiconductor wafers of normal thickness.

The healing time for the p doping which is produced by the proton bombardment is typically 0.5 to 2 hours, while the healing temperature is typically between 350° C. and 450° C. It should not be significantly lower, in order to largely avoid the typical defects caused by the bombardment and which reduce the charge carrier life, such as blanks, double blanks and A centers, and thus also undesirable high leakage currents in the bombarded areas.

The p-doped regions which are produced by the proton bombardment can be verified by the so-called spreading resistance method, and can very probably be explained by the fact that the bombardment produces blanks in the area in the air through which the bombardment has passed, which are converted during the subsequent healing step into complexes which comprise a number of blanks, possibly in conjunction with oxygen, carbon or nitrogen atoms. These complexes act as acceptors and remain stable up to temperatures of at least 450° C.

In the situation where the bombardment does not pass completely through the wafer, with the protons thus emerging again on the other side of the wafer, it is important that the chosen healing temperature is not too high and the healing time is not too long, in order to largely avoid overcompensation for the p doping, which is produced by the proton bombardment, by donors which are caused by the diffusion of hydrogen atoms from the maximum in the concentration of hydrogen atoms (which is formed in the area of the so-called "end of range" during the bombardment) in the area through which the bombardment passes, in conjunction with the formation of hydrogen defect complexes. This is not applicable when this doping is intended to be used, as has already been explained, for deliberate vertical variation of the p doping, for example for an edge termination.

Experiments have shown that a healing temperature of, for example, 380° C. then results in the lightly p-doped zone, while the latter can be overcompensated for if more severe heat treatment is carried out (for example at 450° C.) by the increasing donor concentration in the area between the surface and the "end of range". If it is intended to increase the acceptor concentration further, it is therefore possible, admittedly, to on the one hand increase the hydrogen implantation dose, but on the other hand to reduce the healing temperature.

One advantageous feature of this method is, in particular, that the desired field stop zone as well as the desired, bombardment-dependent, lightly doped p region are produced at the same time by means of an implantation and heat-treatment step.

As alternative to proton bombardment, it would also be possible, for example, to use helium bombardment, in which, which admittedly produces the bombardment-dependent acceptors, although no donors are formed, as would, in fact, also not be necessary in the case of "non-punch-through" components.

One advantageous use of the method is thus the production of deep p regions in silicon during the production of a p-doped emitter with low emitter efficiency for an IGBT. This use of the method comprises a deep p-doped region being located in front of a transparent p emitter of the IGBT by bombardment with high-energy protons from the rear face of the IGBT, with an n-doped field stop zone being produced at the same time at a depth in the component which is governed by the bombardment energy.

A further advantageous use of the method is for the production of an anode of a diode. This use of the method comprises the anode being formed by bombardment with the high-energy protons from the anode type of the diode or an already existing p-doped emitter being reinforced, and with an n-doped field stop zone being produced at the same time at a depth in the diode which is governed by the bombardment energy.

A further use of the method is for the production of an anode for a thyristor. In this use of the method, the anode is formed by bombardment with the high-energy protons from the anode side of the thyristor, or by reinforcing an already existing p-doped emitter and at the same time producing an n-doped field stop zone at a depth in the component which is governed by the bombardment energy.

The quite weakly n-doped field stop zone which is produced by the method according to the invention in the diode or the thyristor allows the switch-off behavior of these components to be weakened, and allows an adequate blocking capability.

A further use of the method according to the invention is to deliberately change the compensation degree by means of the bombardment-induced acceptors on a largely completely processed CoolMOS® component (CoolMOS® is an Infineon Technologies AG trademark), in order, for example, to increase the blocking capability or to improve the avalanche response. If proton bombardment is used, the proton energy can be chosen such that protons emerge again on the rear face of the component, or else are stopped in the highly n-doped drain side of the CoolMOS component. This avoids undesirable additional donors in the area of the column structure.

BRIEF DESCRIPTION OF THE DRAWINGS

The above features and further advantageous features of a method according to the invention and its use for the production of semiconductor components will be explained in more detail in the following description with reference to the drawing, in the figures of which, in detail.

DESCRIPTION

Figure 1:
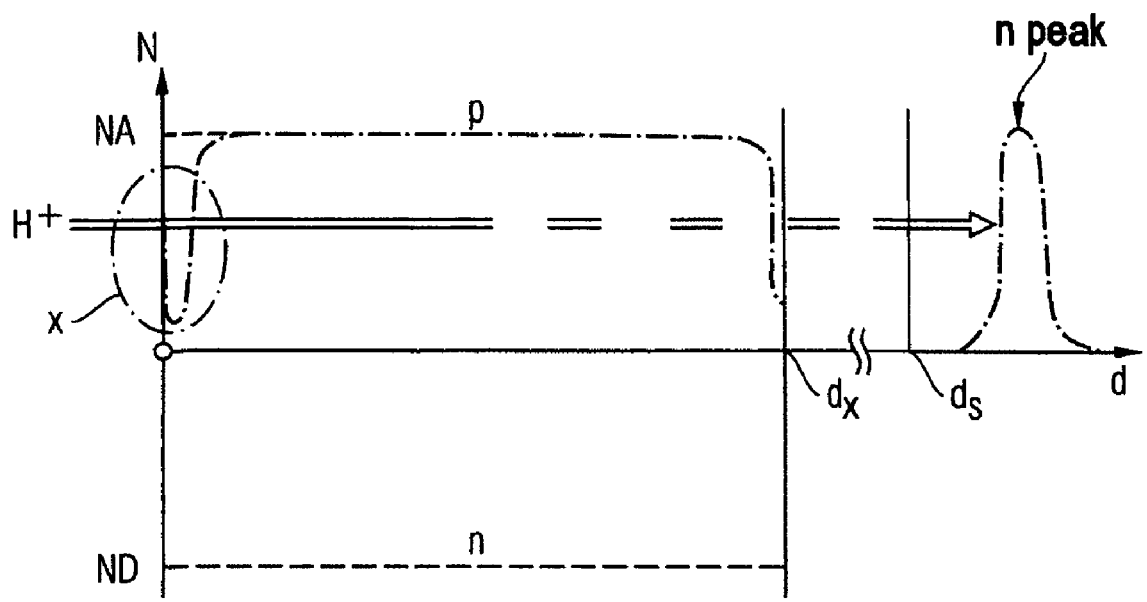
FIG. 1 shows a graph of the profile that is determined by a spreading resistance measurement of the doping concentration in a p-conducting region, which is produced by the method according to the invention by redoping from an n-conductive silicon area, with a proton beam being passed through all of a semiconductor wafer.

All the exemplary embodiments, as described in the following text with reference to the drawing, of semiconductor components which have been produced by the method according to the invention for production of deep p regions in the silicon have the common feature of deliberate compensation (which extends deeply into the semiconductor body), and redoping of an n-conductive region to form a p-conductive region by means of bombardment (which is normally masked for lateral structuring purposes) with high-energy lightweight particles, preferably protons or helium ions. Bombardment with particles such as these produces acceptor-like defects in the semiconductor.

The fundamental effect of bombardment of a silicon wafer with basic n doping with high-energy lightweight particles will be described first of all, with reference to the concentration profile illustrated in the form of a graph in FIG. 1. The depth d is shown in the abscissa direction, and the doping concentration N in the ordinate direction. An arrow annotated $H^+$ illustrates the bombardment, for example proton bombardment. Bombardment such as this changes the previously n-doped silicon region to a p region down to a depth $d_x$. If the particle energy is chosen to be sufficiently high that they pass completely through the thickness of the silicon wafer, which is represented by $d_s$, that is to say they emerge again on the other side of the silicon wafer, this avoids the n doping that is caused by the hydrogen. The p-doped layer or p region which is verified by a combination of various measurement methods (spreading resistance method, scanning capacitance method, thermoprobe measurement) can very probably be explained by the fact that the bombardment produce blanks in the area through which the bombardment has passed, which are converted into complexes which are converted to complexes during the subsequent healing step, which is typically carried out at temperatures of between 380° C. and 420° C. and over a time period of, for example, 1 hour, which complexes comprise a number of blanks, possibly in conjunction with oxygen, carbon or nitrogen atoms. These complexes act as acceptors, and are stable up to temperatures of at least 450° C.

In the area close to the surface which is surrounded by a circle and is annotated X, the spreading resistance measurement results in a reduction in the p doping produced by the bombardment with the high-energy lightweight particles, which can be explained by major defect formation in the area close to the surface. When isolating diffusion is being replaced, it may therefore be necessary to additionally diffuse p-doped regions into this faulty area before the bombardment process, for example by means of boron or aluminum diffusion, in order to ensure correct potential linking over this vertical p-doped zone. On the other hand, the additional boundary surface states caused by these defects lead to an improvement in the contact resistance between the semiconductor and metallization deposited on it. This means that this avoids the formation of a Schottky contact or of a high-impedance contact.

If the energy of the protons is chosen such that the hydrogen atoms are stopped in the silicon crystal, that is to say an n-doped peak is produced at a depth which is dependent on this energy, the healing temperature must not, however, be too high and the healing time must not be too long in order to avoid the possibility of overcompensation for the bombardment-dependent p doping by donors which are caused by the diffusion of hydrogen atoms from the maximum in the concentration of hydrogen atoms (which is formed in the area of the so-called "end of range" during the bombardment) in the area through which the bombardment passes, in conjunction with the formation of hydrogen defect complexes.

The principle according to the invention as illustrated in FIG. 1 can be used for the production of various semiconductor components, such as IGBTs, diodes, thyristors, Cool-MOS components and the like.

Figure 2:
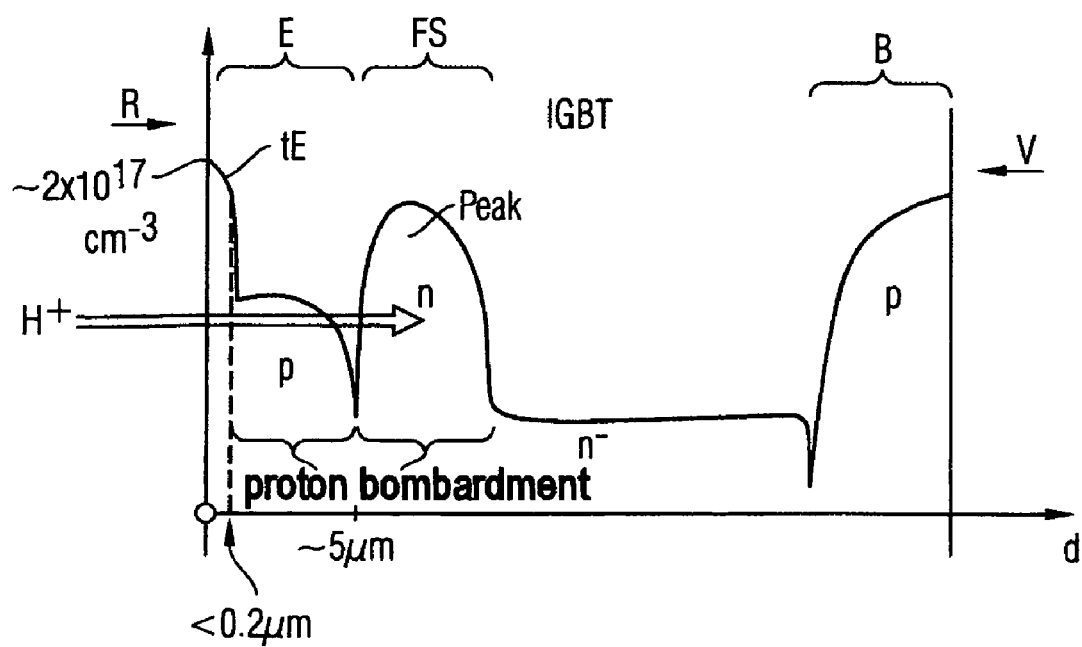
FIG. 2 shows a graph of the doping concentration profile for an IGBT component, in order to illustrate a first example of the use of the method according to the invention for production of a p-doped emitter with low emitter efficiency, and with a field stop zone at a desired depth in the IGBT.

FIG. 2 shows a first such use of the method according to the invention for the production of an IGBT. FIG. 2 once again shows the doping concentration profile, to be precise through the entire IGBT, whose front face is annotated V and whose rear face is annotated R. In this case, the method according to the invention is used to produce a p-doped emitter with low emitter efficiency, which at the same time makes a good resistive contact, and in which process-dependent inhomogeneities, such as particles on the wafer surface during the ion implantation process, have no disadvantageous effects on the electrical characteristics of the IGBT containing this p emitter. It should be mentioned that the IGBT illustrated in FIG. 2 has a transparent emitter tE, which is shown by a dashed line, on the rear face R. The method according to the invention results in hydrogen atoms being implanted from the rear face R of the IGBT which has been completely processed as far as that stage, by means of the bombardment illustrated by the arrow $H^+$. If the bombardment energy is chosen appropriately, this results in an n-doped field stop zone FS being produced at a specific wafer depth, for example 5 micrometers, and if the healing temperature and the healing time are chosen appropriately, this at the same time results in a lightly p-doped zone, which is located in front of the transparent emitter tE, in the area of the wafer close to the surface, the two of which together form a p emitter E. Typical healing temperatures are, for example, between 380° C. and 420° C., and are carried out over a time period of, for example, one hour. Those regions which are located towards the front face V of the IGBT, such as the p body B, are not influenced by the bombardment with high-energy protons according to the invention. The $n^+$-doped source regions and the gate on the front face of the IGBT are not shown, for the sake of simplicity.

The reduction in the p doping immediately adjacent to the surface of the rear face R, which occurs only at an extremely short distance from the semiconductor surface because of the considerably shallower penetration depth of the protons in this example, is overcompensated for by the transparent emitter tE with a p edge concentration of approximately $2 \cdot 10^{17}$ cm$^{-3}$.

Figure 3:
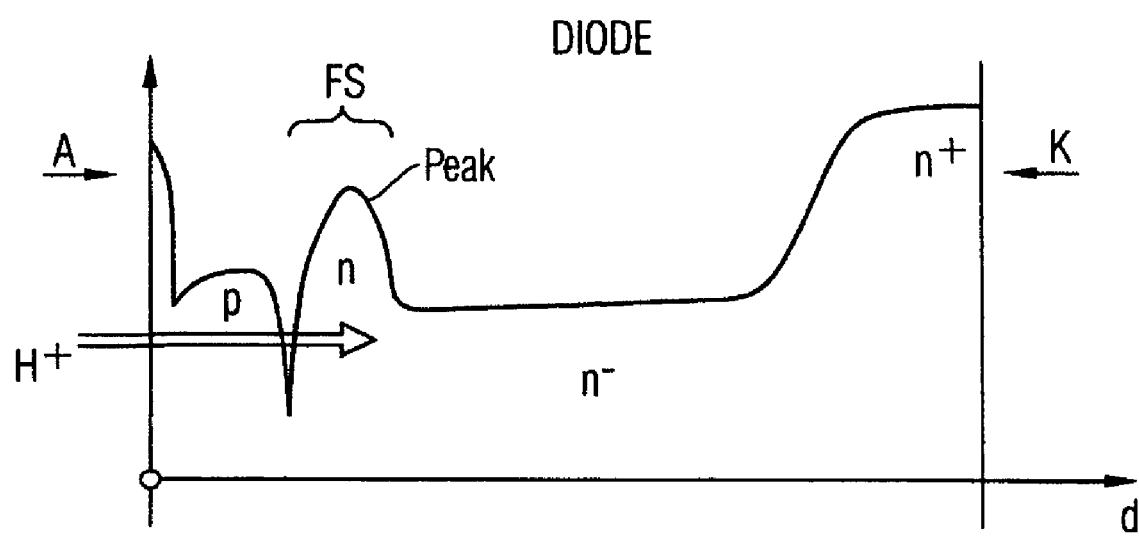
FIG. 3 shows a graph of the doping concentration profile for a diode, in order to illustrate a second example of the use of the method according to the invention for production of an anode and for a field stop zone at a desired depth in the diode.

As is shown in FIG. 3, the method according to the invention can also be used for the production of a diode in which a lightly n-doped field stop zone FS, which is likewise induced by the bombardment and is located in front of the desired p anode, comprising a $p^+$-contact lift and a bombardment-induced p layer, is produced by the proton bombardment from the anode side A as proposed by the invention, resulting in this diode having a softer switch-off response. The cathode region of the diode, which is located towards the cathode side K, remains unchanged despite the bombardment.

Figure 4:
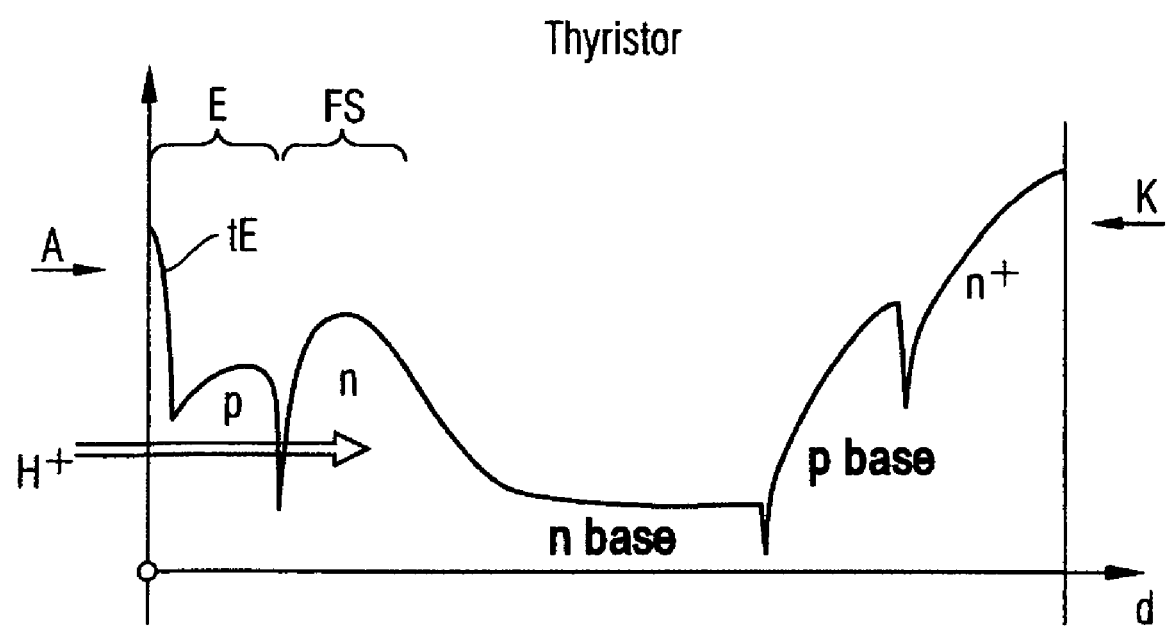
FIG. 4 shows a graph of the doping concentration profile for a thyristor, in order to illustrate a third example of the use of the method according to the invention for the production of an anode and of a field stop zone at a desired depth in the thyristor.

A further example of the use of the method according to the invention is illustrated in FIG. 4 on the basis of the overall doping concentration profile of an asymmetric thyristor component. The proton bombardment according to the invention, which is carried out from the anode side A of the component and is illustrated by the $H^+$ arrow, produces a p-conductive region immediately adjacent to the transparent emitter tE, which, together with the transparent emitter tE, forms the p emitter E and, in a similar way to the diode illustrated in FIG. 3, forms an adjacent field stop zone FS, which is represented by the n peak. The subsequent doping profile of the $n^-$ base, p base and $n^+$ cathode towards the cathode side K remain uninfluenced despite the bombardment which is carried out according to the invention in order to produce the p emitter region E and the field stop zone FS.

Figure 5:
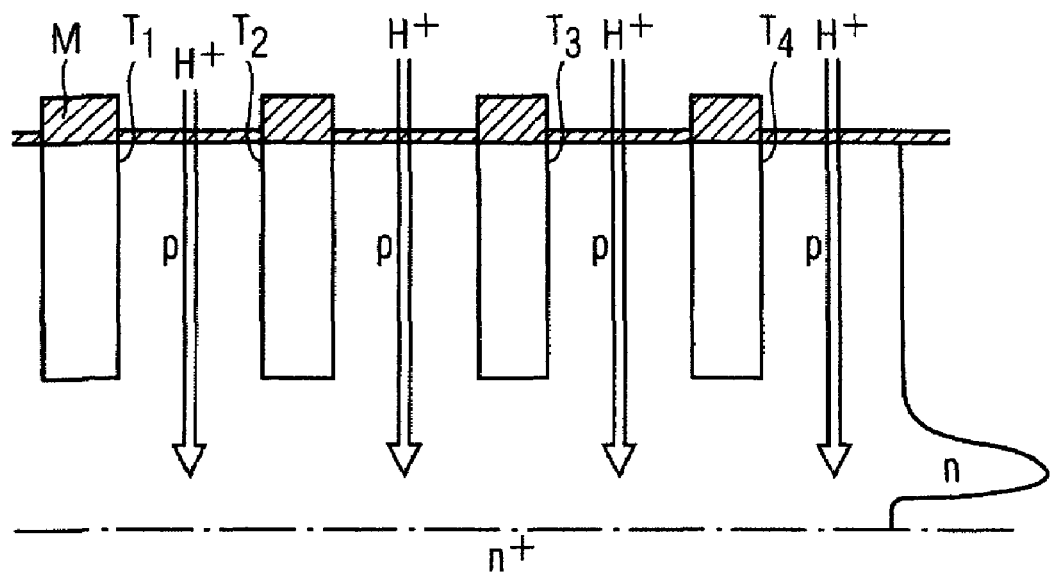
FIG. 5 shows a schematic cross section through a CoolMOS component, illustrating a fourth example of the use of the method according to the invention for deliberately changing the compensation degree of the largely completely processed CoolMOS component.
Figure 6:
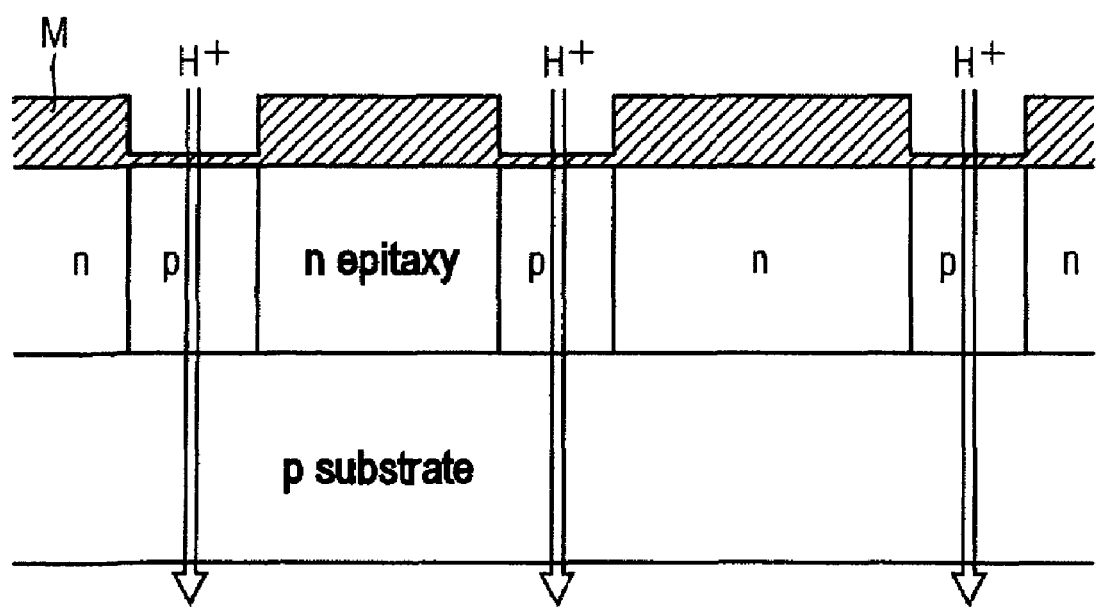
FIG. 6 shows a schematic cross section to illustrate a fifth example of the use of the method according to the invention for carrying out an isolating diffusion.

The next two examples of the use of the method according to the invention, which are illustrated in FIG. 5 and FIG. 6, use a bombardment mask annotated M. FIG. 5 shows a schematic cross section through a CoolMOS® component. The mask M is preferably located on one surface of the component. The method according to the invention is in this case used to deliberately change the degree of compensation on the largely completely processed CoolMOS® component by means of the acceptors which are induced by the bombardment with high-energy lightweight particles in order in this way, for example, to increase the blocking capability or to improve the avalanche response. As already mentioned the energy of the proton bombardment H⁺ can be chosen to be sufficiently high that the protons emerge again from a thinned mask area on the rear face of the component, while they are completely absorbed in the thick areas of the mask. Thus, alternatively and as is shown in FIG. 5, the n peak which produces the donor effect may be located in the vicinity of or else in the highly doped n-conductive drain side of the CoolMOS component. This avoids undesirable additional donors in the area of the column structure T1, T2, T3, T4. However, if required, the bombardment process can also be carried out without using a mask, although the bombardment doses must be appropriately adapted in this case. This makes it possible to produce an n semiconductor/metal junction which has a low contact resistance.

Finally, FIG. 6 shows the embodiment of an alternative for so-called isolating diffusion, in which an n epitaxial layer is redoped to form a p region in the regions which are not screened by the mask M by means of the bombardment, as proposed according to the invention, with high-energy lightweight particles, for example protons (arrow H⁺). The energy of the protons H⁺ can be chosen to be sufficiently high that they pass completely through the silicon wafer underneath the thinned area of the metal mask M, thus avoiding the hydrogen-correlated donor effect. The protons are completely absorbed in the thick areas of the mask. The advantage of this method over conventional isolating diffusion is that the p regions which are produced do not diffuse out laterally, or virtually do not diffuse out laterally. Instead of being produced in an n epitaxial layer, these p regions, which extend deeply into the semiconductor crystal, can also be produced locally in completely processed silicon wafers on which no epitaxial layers have been deposited, but in which the basic doping of the n base zone or n-doped drift zone has been set during the crystal synthesis or by means of the so-called "neutron transmutation doping" method.

The major advantage of the use of lightweight high-energy particles, as proposed for the method according to the invention, is the relatively large penetration depth of these particles into silicon. For example, in the case of protons, penetration depths of up to several hundred micrometers can be achieved, depending on the acceleration energy.

The already mentioned improvement in the contact resistance resulting from bombardment-dependent defects in the area of the boundary surface between the p-doped semiconductor body and the metallization can also be achieved between an n-doped semiconductor region and a metal layer deposited on it.

The invention claimed is:

1. A method for production of deep p regions in the silicon of a semiconductor component, the method comprising:
   bombarding an n region of the semiconductor component with high-energy particles; and
   healing the n region for a specific healing time at a specific healing temperature; wherein the step of bombarding the n region with high energy particles comprises masking the semiconductor component with a metal mask, wherein the mask is greatly thinned at regions in the semiconductor component where the bombarding step is intended to take place such that the particles lose substantially no energy in passing through the thinned sections of the mask, and wherein the mask is sufficiently thick in remaining regions of the semiconductor component such that the particles are completely absorbed and wherein the bombardment energy is sufficiently high such that the particles pass completely through the semiconductor component in the bombarded regions and emerge again on an opposite face of the semiconductor component such that the n region is redoped to become a p region at a desired depth after the specific healing time and at the specific healing temperature.

2. The method of claim 1 wherein the n region is an exposed n substrate.

3. The method of claim 1 wherein the n region is an n epitaxial section.

4. The method of claim 1 wherein the n region is a weakly doped n region.

5. The method of claim 1 wherein the high energy particles are selected from the group consisting of protons, helium atoms and electrons.

6. The method of claim 1 wherein the healing time is from 0.5 to 2 hours, and the healing temperature is between 350° C. and 450° C.

7. The method of claim 5 wherein the step of bombarding the n region of the semiconductor component with high-energy particles comprises the use of at least one proton beam.

8. The method of claim 1 wherein a defect concentration is formed on a surface of the p region formed by bombardment, wherein the p region is intended to make contact with a contact metal, and wherein the defect concentration is raised in order to avoid Schoffky transitions or high impedance contacts, thereby producing a resistive contact with a low contact resistance to the contact metal.

9. The method of claim 8 wherein conductivity is raised in a region close to the surface by means of p-doped regions which are diffused in before the step of bombarding.

10. The method of claim 1 wherein the method produces a p emitter with low emitter efficiency for an IGBT, wherein the step of bombarding with high energy particles from a rear face of the IGBT forms a deep p-doped region in front of a transparent emitter of the IGBT, which deep p doped region, together with the transparent emitter, forms the p emitter, and an n-doped field stop zone is formed at the same time at a depth in the semiconductor component dependent upon the bombardment energy.

11. The method of claim 1 wherein the method produces a diode, and wherein a p-doped emitter of the diode is reinforced by the step of bombarding with the high-energy particles at the desired depth, and an n-doped field stop zone is produced at the same time at a depth in the semiconductor component dependent upon the bombardment energy.

12. The method of claim 1 wherein the method produces an anode for a thyristor, and wherein an anode-side emitter is reinforced by the step of bombarding with the high-energy particles from an anode side of the thyristor at the desired depth, and an n-doped field stop zone is produced at the same time at a depth in the component which is dependent upon the bombardment energy.

13. The method of claim 1 wherein the method produces a resistive contact between a contact metal and a semiconductor area which is bombarded with high-energy particles.

14. The method of claim 1 wherein the method varies the compensation degree in COOLMOS® components in order to set a breakdown voltage.

15. The method of claim 1 wherein the semiconductor component comprises a semiconductor wafer.

* * * * *